United States Patent
Hsu

(10) Patent No.: US 11,569,805 B2
(45) Date of Patent: Jan. 31, 2023

(54) MINIMUM INTRINSIC TIMING UTILIZATION AUTO ALIGNMENT ON MULTI-DIE SYSTEM

(71) Applicant: MEDIATEK INC., Hsin-Chu (TW)

(72) Inventor: Ying-Yu Hsu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/548,571

(22) Filed: Dec. 12, 2021

(65) Prior Publication Data
US 2022/0294435 A1   Sep. 15, 2022

Related U.S. Application Data

(60) Provisional application No. 63/160,941, filed on Mar. 15, 2021.

(51) Int. Cl.
*H03K 5/131*   (2014.01)
*H04L 7/00*    (2006.01)
*H03M 9/00*    (2006.01)
*H03K 5/00*    (2006.01)

(52) U.S. Cl.
CPC .............. *H03K 5/131* (2013.01); *H03M 9/00* (2013.01); *H04L 7/0033* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 9,312,868 B2* | 4/2016 | Kim | H03L 7/1978 |
| 9,742,603 B1 | 8/2017 | Bandi | |
| 9,881,664 B1 | 1/2018 | Ying | |
| 10,103,718 B1* | 10/2018 | Swanson | G11C 7/1093 |
| 10,447,466 B2 | 10/2019 | Hsu | |
| 11,031,928 B2* | 6/2021 | Muraguchi | H03K 5/1504 |
| 2011/0047319 A1 | 2/2011 | Jeon | |
| 2016/0141013 A1 | 5/2016 | Lin | |
| 2020/0389159 A1 | 12/2020 | Ware | |

FOREIGN PATENT DOCUMENTS

TW    I708482 B    10/2020

* cited by examiner

*Primary Examiner* — Cassandra F Cox
(74) *Attorney, Agent, or Firm* — Winston Hsu

(57) ABSTRACT

The present invention provides a system including a transmitter and a receiver is disclosed. The transmitter includes a first main data path and a first main strobe path, wherein the first main data path is configured to generate a plurality of data signals, the first main strobe path is configured to generate a first strobe signal, and delay amount of the first main data path and delay amount of the first main strobe path are unbalanced. The receiver includes a second main data path and a second main strobe path, wherein the second main strobe path is configured to receive the first strobe signal to generate a plurality of second strobe signals, and the second main data path is configured to receive the plurality of data signals, and uses the plurality of second strobe signals to sample the plurality of data signals to generate a plurality of sampled signals, respectively.

10 Claims, 4 Drawing Sheets

MINIMUM INTRINSIC TIMING UTILIZATION AUTO ALIGNMENT ON MULTI-DIE SYSTEM

CROSS REFERENCE TO RELATED APPLICATIONS

This application claims the priority of U.S. Provisional Application No. 63/160,941 (filed on Mar. 15, 2021), which is included herein by reference in its entirety.

BACKGROUND

In a cross-chip system, a first chip generally has a strobe path and a plurality data paths for generating a strobe signal and data signals to a second chip, and the second chip uses the received strobe signal to sample the received data signals to obtain the required signals. In order to ensure that the second chip can obtain the correct data, the data paths and the strobe path within the first chip and/or the second chip are designed to have many physical balance delay elements, adjustable delay elements and/or multi-phase clock generator to synchronize the strobe signal and the data signals. However, setting the above elements within the data paths and the strobe path of the first/second chip will increase data and strobe latency and lower the performance, and the power consumption is increased.

SUMMARY

It is therefore an objective of the present invention to provide a system, which can achieve synchronization of data signals and the strobe signal under low power consumption and low latency, to solve the above-mentioned problems.

According to one embodiment of the present invention, a system comprising a transmitter and a receiver is disclosed. The transmitter comprises a first main data path and a first main strobe path, wherein the first main data path is configured to generate a plurality of data signals, the first main strobe path is configured to generate a first strobe signal, and delay amount of the first main data path and delay amount of the first main strobe path are unbalanced so that the strobe signal and the plurality of data signals are not aligned. The receiver comprises a second main data path and a second main strobe path, wherein the second main strobe path is configured to receive the first strobe signal to generate a plurality of second strobe signals, and the second main data path is configured to receive the plurality of data signals, and uses the plurality of second strobe signals to sample the plurality of data signals to generate a plurality of sampled signals, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
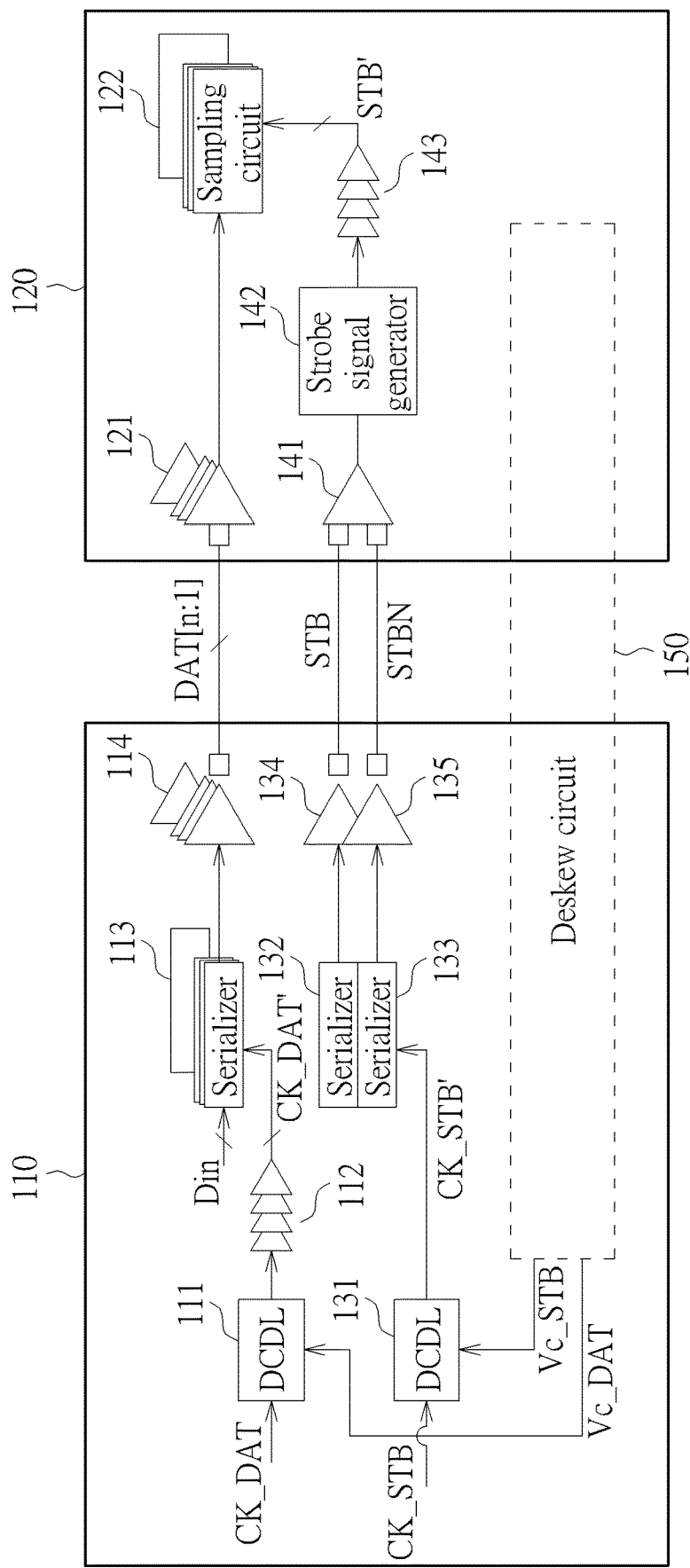
FIG. 1 shows a system according to one embodiment of the present invention.

FIG. 1 shows a system 100 according to one embodiment of the present invention. As shown in FIG. 1, the system 100 comprises two dies 110 and 120 connected to each other, wherein the die 110 serves as a transmitter to transmit a plurality of data signals DAT[n:1] and strobe signals STB and STBN to the die 120 serving as the receiver. The die 110 comprises a main data path and a main strobe path, wherein the main data path of the die 100 comprises a delay circuit such as a digital control delay line (DCDL) 111, a clock tree synthesizer 112, a plurality of serializer 113 and a plurality of transmitter input/output circuits (TXIO) 114. The main strobe path of the die 110 comprises a delay circuit such as a DCDL 131, two serializers 132 and 133, and two TXIO 134 and 135. In addition, the die 120 comprises a main data path and a main strobe path, wherein the main data path of the die 120 comprises a plurality of receiver input/output circuits (RXIO) 121 and a plurality of sampling circuits 122. The main strobe path of the die 120 comprises a RXIO 141, a strobe generator 142 and a clock tree synthesizer 143. In this embodiment, the system 100 is a cross-chip system comprises a plurality of dies within a package (e.g., three-dimensional integrated circuit, 3D IC), however, this feature is not a limitation of the present invention. In other embodiments, the transmitter of the die 110 and the receiver of the die 120 may be integrated into a single die.

In the operation of the main data path of the die 110, the DCDL 110 receives a reference clock signal CK_DAT to generate a delayed clock signal, and the clock tree synthesizer 112 receives the delayed clock signal to generate a plurality of clock signals CK_DAT' to the serializers 113, respectively. The serializers 113 uses the clock signals CK_DAT' to sample a plurality of input signals Din to generate the data signals DAT[n:1] to the die 120 via the TXIO 114. In the operation of the main strobe path of the die 110, the DCDL 131 receives a reference clock signal CK_STB to generate a delayed clock signal CK_STB', and the serializers 132 and 133 receives the delayed clock signal CK_STB' to generate the strobe signals STB and STBN (differential signals) to the die 120 via the TXIO 134 and 135.

In the operation of the main strobe path of the die 120, the RXIO 141 receives the strobe signals STB and STBN to generate a signal to the strobe signal generator 142 to generate a strobe signal, for the clock tree synthesizer 143 to generate a plurality of strobe signals STB' to the sampling circuits 122, respectively. In the operation of the main data path of the die 110, the RXIO 121 receives the data signals DAT[n:1], for the sampling circuits 122 to use the strobe signals STB' to sample the data signals DAT[n:1] to generate sampled signals, respectively.

In the conventional art, the main data path and the main strobe path of the die 110 are designed to have similar delay amount, that is the conventional art may add an additional clock tree synthesized between the DCDL 131 and the serializer 132/133, so that the reference clock signal CK_DAT and the reference clock signal CK_STB are delayed with the same or similar delay amount. Similarly, the main data path and the main strobe path of the die 120 are also designed to have similar delay amount, that is the conventional art may add an additional delay circuit between the RXIO 121 and the sampling circuits 122, so that the data signals DAT[n:1] and the received strobe signal are delayed with the same or similar delay amount. Therefore, because the conventional art uses a physical balance circuit to align the data signals and the strobe signals, the conventional art will increase data and strobe latency and lower the performance, and the power consumption is increased.

To solve the above problems of the conventional art, the die 110 and the die 120 are designed to have minimum intrinsic timing utilization to lower the data and strobe latency. Specifically, the main data path and the main strobe path within the die 110 have the unbalanced architecture, for example, the main strobe path does not have the clock tree synthesizer to lower the strobe latency. Therefore, in this embodiment, the phase of each of the data signals DAT[n:1] lags the phase of the strobe signals STB and STBN. Similarly, the main data path and the main strobe path within the die 120 may also have the unbalanced architecture, for example, the main data path of the die 120 does not have the clock tree synthesizer to lower the data latency.

Figure 2:
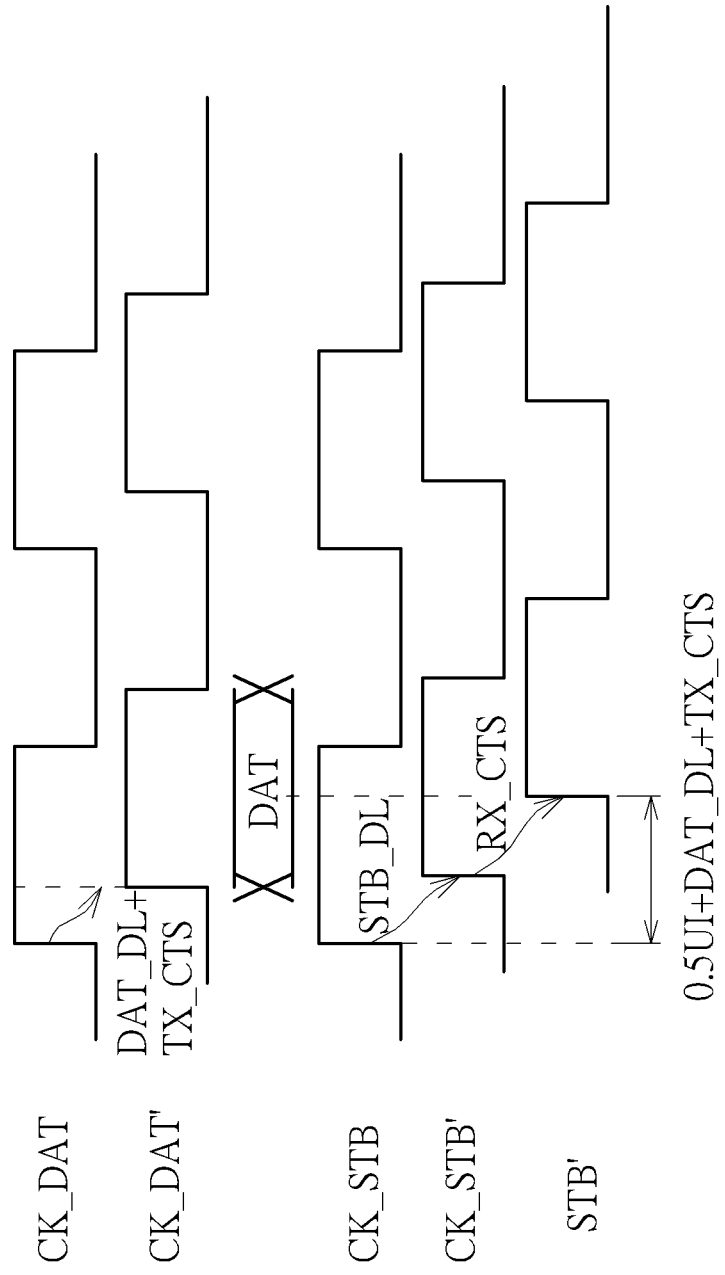
FIG. 2 shows a timing diagram of the signals CK_DAT, CK_DAT', DAT, CK_STB, CK_STB', STB' according to one embodiment of the present invention.

In the embodiment shown in FIG. 1, the die 110 and the die 120 are designed to have the unbalanced architecture to lower the data latency and the strobe latency, however, the unaligned strobe signal or the misaligned strobe signal may cause the sampling circuits 122 to generate incorrect sampled signals. Therefore, the system 100 is further designed to have a deskew circuit 150 to generate control signals Vc_DAT and Vc_STB to control the delay amount of the DCDLs 111 and 131, respectively, to make the data signals DAT[n:1] and the strobe signals STB' inputted into the sampling circuits 122 have the suitable phases. Specifically, referring to FIG. 2 which shows a timing diagram of the signals CK_DAT, CK_DAT', DAT, CK_STB, CK_STB', STB' according to one embodiment of the present invention. As shown in FIG. 2, assuming that delay amount of the DCDL 111, the clock tree synthesizer 112, the DCDL 131 and the clock tree synthesizer 143 (with the strobe signal generator 142) are DAT_DL, TX_CTS, STB_DL and RX_CTS, respectively, the total delay of the main data path of the die 110 is a summation of DAT_DL, TX_CTS and a driver delay (i.e. the delay caused by the serializers 113 and TXIO 114) , the total delay of the main strobe path of the die 110 is a summation of STB_DL and a driver delay (i.e. the delay caused by the serializers 132, 133 and TXIO 134, 135), the total delay of the main data path of the die 120 is the delay caused by the RXIO 121, and the total delay of the main strobe path of the die is a summation of RX_CTS and the delay caused by the RXIO 141. Therefore, the deskew circuit 150 is configured to control the DCDLs 111 and 131 so that a rising edge of the strobe signal STB' is at the center of the data signal DAT, that is the DCDLs 111 and 131 are controlled to satisfy the following equation:

$$RX\_CTS-TX\_CTS+(STB\_DL-DAT\_DL)=0.5*UI \quad (1);$$

wherein the symbol "UI" is an unit interval of the clock signal (i.e., half of the clock cycle), and it is assumed that the clock signals used in the main data path and the main strobe path have substantially the same frequency.

Figure 3:
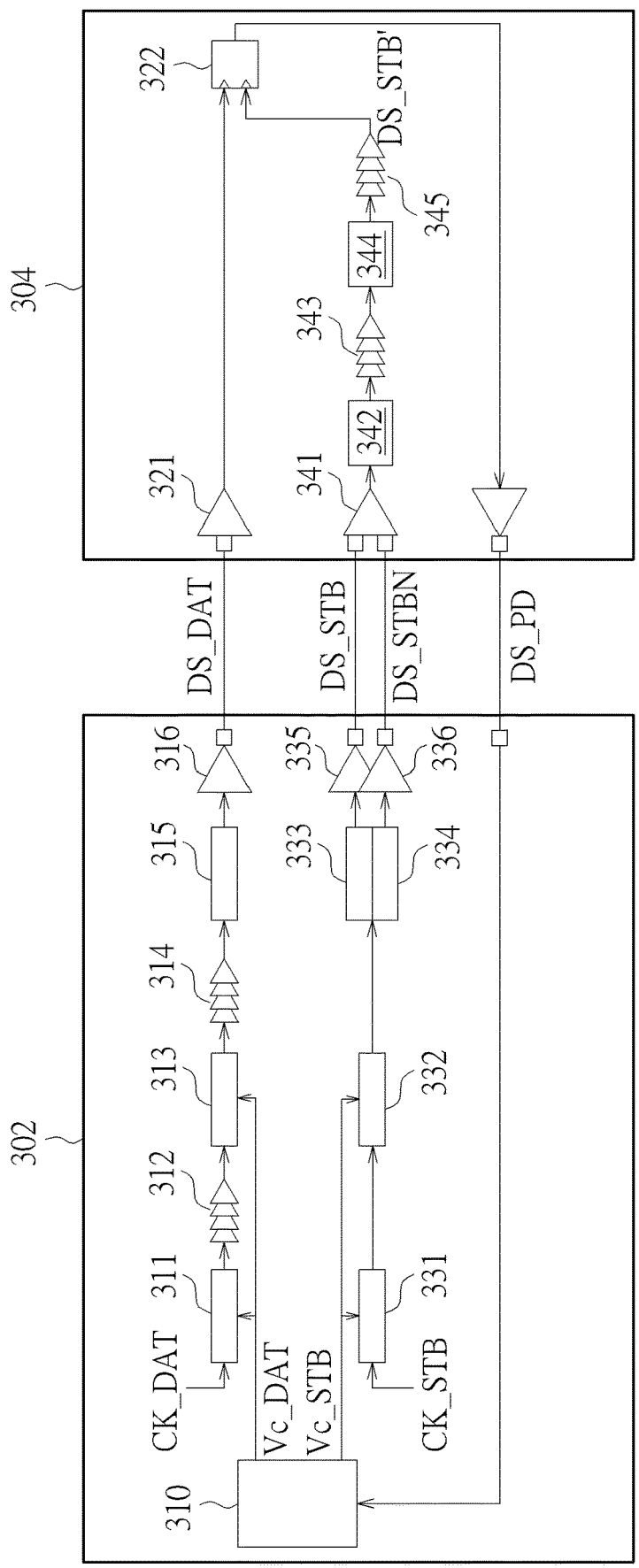
FIG. 3 is a diagram illustrating the deskew circuit according to one embodiment of the present invention.

FIG. 3 is a diagram illustrating the deskew circuit 150 according to one embodiment of the present invention. As shown in FIG. 3, the deskew circuit 150 comprises a first circuit 302 and a second circuit 304, wherein the first circuit 302 is within the die 110, and the second circuit 304 is within the die 120. The first circuit 302 comprises a control circuit 310, a data path and a strobe path, wherein the data path of the first circuit comprises a DCDL 311, a clock tree synthesizer 312, a DCDL 313, a clock tree synthesizer 314, a serializer 315 and a TXIO 316; and the strobe path of the first circuit 302 comprises a two DCDLs 331 and 332, two serializers 333 and 334, and two TXIO 335 and 336. The second circuit 304 comprises a data path and a strobe path, wherein the data path of the second circuit 304 comprises a RXIO 321 and a phase detector 322; and the strobe path of the second circuit 304 comprises a RXIO 341, a strobe signal generator 342, a clock tree synthesizer 343, the strobe signal generator 344 and a clock tree synthesizer 345.

In this embodiment, the data path of the first circuit 302 of the deskew circuit 150 is designed to have the DCDL 311, the clock tree synthesizer 312, the DCDL 313 and the clock tree synthesizer 314 so that its delay amount is twice that of the main data path of the die 110. Specifically, each of the DCDL 311 and the DCDL 313 can be controlled by the control signal Vc_DAT, so that the DCDL 111, the DCDL 311 and the DCDL 313 have the same delay amount; and the delay amount of each of the clock tree synthesizers 312 and 314 is equal to the delay amount of the clock tree synthesizer 112. Similarly, the strobe path of the first circuit 302 of the deskew circuit 150 is designed to have the DCDL 331 and the DCDL 332 so that its delay amount is twice that of the main strobe path of the die 110. Specifically, each of the DCDL 331 and the DCDL 332 can be controlled by the control signal Vc_STB, so that the DCDL 131, the DCDL 331 and the DCDL 332 have the same delay amount. In addition, the strobe path of the second circuit 304 of the deskew circuit 150 is designed to have the strobe signal generator 342, the clock tree synthesizer 343, the strobe signal generator 344 and the clock tree synthesizer 345 so that its delay amount is twice that of the main strobe path of the die 120. Specifically, the strobe signal generators 142, 342 and 344 have the same delay amount, and the delay amount of each of the clock tree synthesizers 343 and 345 is equal to the delay amount of the clock tree synthesizer 143.

In the operation of the data path of the first circuit 302 of the deskew circuit 150, the reference clock signal CK_DAT passes throughs the DCDL 311, the clock tree synthesizer 312, the DCDL 313 and the clock tree synthesizer 314 to generate a delayed clock signal, and the serializers 315 uses the delayed clock signal to sample the input signal such as Din to generate the data signal DS_DAT to the die 120 via the TXIO 321. In the operation of the strobe path of the first circuit 302 of the deskew circuit 150, the reference clock signal CK_STB passes through the DCDL 331 and the DCDL 332 to generate a delayed clock signal, and the serializers 333 and 334 receives the delayed clock signal to generate the strobe signals DS_STB and DS_STBN (differential signals) to the die 120 via the TXIO 335 and 336.

In the operation of the strobe path of the second circuit 304 of the deskew circuit 150, the RXIO 341 receives the strobe signals DS_STB and DS_STBN to generate a signal, and this signal passes through the strobe signal generator 342, the clock tree synthesizer 343, the strobe signal generator 344 and the clock tree synthesizer 345 to generate a strobe signal DS_STB'. In the operation of the data path of the second circuit 304 of the deskew circuit 150, the RXIO 321 receives the data signal DS_DAT, and the phase detector 322 compares phases of the data signal DS_DAT and the strobe signal DS_STB' to generate a phase detection result DS_PD to the control circuit 310 to align the data signal DS_DAT and the strobe signal DS_STB'. For example, when the phase detection result DS_PD indicates that the phase of the data signal DS_DAT lags the phase of the strobe signal DS_STB', the control circuit 310 generates the control signal Vc_DAT to reduce the delay mount of the DCDL 311/313, and/or generates the control signal Vc_STB to increase the delay amount of the DCDL 331/332. In addition, when the phase detection result DS_PD indicates that the phase of the data signal DS_DAT leads the phase of the strobe signal DS_STB', the control circuit 310 generates the control signal Vc_DAT to increase the delay mount of the DCDL 311/313, and/or generates the control signal Vc_STB to reduce the delay amount of the DCDL 331/332.

Figure 4:
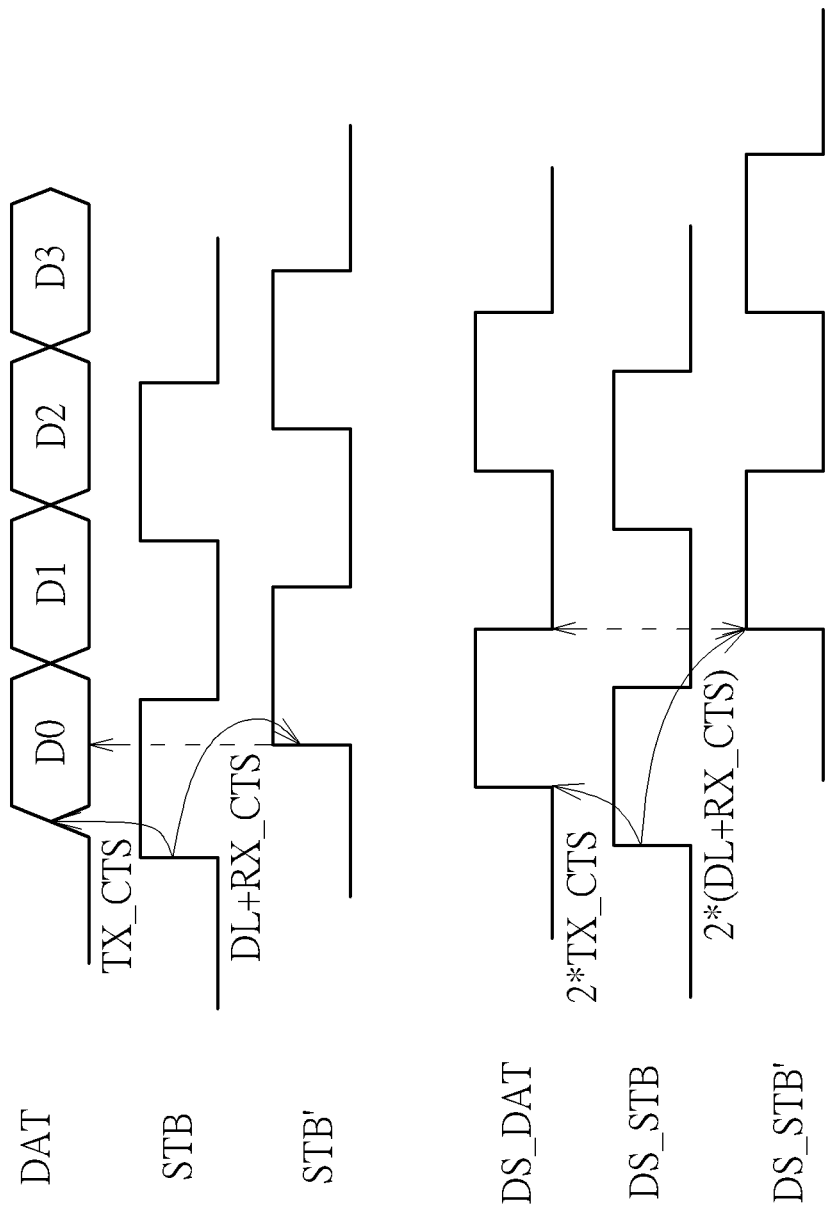
FIG. 4 shows a timing diagram of the signals CK, STB, STB', DS_DAT, DS_STB and DS_STB' according to one embodiment of the present invention.

By using the control circuit 310 of the deskew circuit 150 to refer to the phase detection result DS_PD to align the data signal DS_DAT and the strobe signal DS_STB', the main data path and the main strobe path of the die 110 and the die 120 can be automatically controlled so that the rising edge of the strobe signal STB' is at the center of the data signal DAT, for the sampling circuit 122 to output the correct sampled signal. Specifically, referring to FIG. 4 which shows a timing diagram of the signals CK, STB, STB', DS_DAT, DS_STB and DS_STB' according to one embodiment of the present invention. As shown in FIG. 4, the deskew circuit 150 is configured to control the DCDLs 311, 313, 331 and 332 to align the data signal DS_DAT and the strobe signal DS_STB', that is the DCDLs 311, 313, 331 and 332 are controlled to satisfy the following equation:

$$2*DL+2RX\_CTS-2*TX\_CTS=1*UI \qquad (2);$$

wherein the symbol DL is equal to a difference between the delay amount of the DCDL 331 and the delay amount of the DCDL 311, that is DL=(STB_DL−DAT_DL). In addition, since equation (2) is satisfied, the equation (1) is satisfied.

Briefly summarized, in the system of the present invention, by designing the deskew circuit to control the delay amount of the DCDLs within the main data path and the main strobe path, the die 110 and the die 120 can be designed to have the unbalanced architecture to lower the data latency and the strobe latency to improve the performance of the communications of the dies 110 and 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system, comprising:
    a transmitter, comprising a first main data path and a first main strobe path, wherein the first main data path is configured to generate a plurality of data signals, the first main strobe path is configured to generate a first strobe signal, the first main data path comprises a first delay circuit, the first main strobe path comprises a second delay circuit, and a delay amount of the first main data path and a delay amount of the first main strobe path are unbalanced so that the strobe signal and the plurality of data signals are not aligned; and
    a receiver, comprising a second main data path and a second main strobe path, wherein the second main strobe path is configured to receive the first strobe signal to generate a plurality of second strobe signals, and the second main data path is configured to receive the plurality of data signals, and uses the plurality of second strobe signals to sample the plurality of data signals to generate a plurality of sampled signals, respectively;
    a deskew circuit, configured to generate a first control signal and a second control signal to control the delay amount of the first delay circuit and the second delay circuit, respectively.

2. The system of claim 1, wherein the system comprises a first die and a second die, the transmitter is within the first die, and the receiver is within the second die.

3. The system of claim 1, wherein the first main data path comprises:
    the first delay circuit, configured to receive a first reference clock signal to generate a delayed first reference clock signal;
    a clock tree synthesizer, configured to receive the delayed reference clock signal to generate a plurality of first clock signals; and
    a plurality of first serializers, configured to use the plurality of first clock signals to sample input signals to generate the plurality of data signals; and
    the first main strobe path comprises:
    the second delay circuit, configured to receive a second reference clock signal to generate a second clock signal;
    a second serializer, configured to receive the second clock signal to generate the strobe signal.

4. The system of claim 3, wherein there is no clock tree synthesizer between the second delay circuit and the second serializer.

5. The system of claim 1, wherein delay amount of the second main data path and delay amount of the second main strobe path are unbalanced.

6. The system of claim 5, wherein the second main strobe path comprises:
    a strobe signal generator and a clock tree synthesizer, configured to receive the strobe signal to generate a plurality of second strobe signals; and
    the second main data path comprises:
    a sampling circuit, configured to use the plurality of second strobe signals to sample the plurality of data signals to generate the plurality of sampled signals, respectively.

7. The system of claim 6, wherein there is no clock tree synthesizer positioned in the second main data path.

8. The system of claim 1, wherein the deskew circuit comprises a first data path, a first strobe path, a second data path and a second strobe path; the first data path comprises a third delay circuit whose delay amount is twice that of the first delay circuit within the first main data path, the first strobe path comprises a fourth delay circuit whose delay amount is twice that of the second delay circuit within the first main strobe-path.

9. The system of claim 8, wherein the second data path is configured to receive a first signal generated by the first data path, the second strobe path is configured to receive a second signal generated by the first strobe path, and the second data path comprises a phase comparator to compare phases of the first signal and the second signal to generate a phase detection result; and the deskew circuit further comprises a control circuit to generate the first control signal and the second control signal according to the phase detection result, wherein the first control signal is used to control the first delay circuit and the third delay circuit, and the second control signal is used to control the second delay circuit and the fourth delay circuit.

10. The system of claim 9, wherein the system comprises a first die and a second die, the transmitter is within the first die, the receiver is within the second die, the first data path and the first strobe path of the deskew circuit are within the first die, and the second data path and the second strobe path of the deskew circuit are within the second die.

\* \* \* \* \*